United States Patent [19]
Pahr

[11] Patent Number: 5,155,353
[45] Date of Patent: Oct. 13, 1992

[54] HIGH DYNAMIC RANGE INTEGRATED OPTO-ELECTRONIC SENSOR AND MOSFET AMPLIFIERS FOR PULSED LIGHT

[75] Inventor: Per O. Pahr, Lier, Norway
[73] Assignee: Tandberg Data, Norway
[21] Appl. No.: 744,877
[22] Filed: Aug. 14, 1991
[51] Int. Cl.$^5$ ............................................. H01J 40/14
[52] U.S. Cl. ........................ 250/214 R; 250/214 RC
[58] Field of Search ........ 250/214 R, 214 RC, 214 A, 250/213 A, 214 AG, 208.1, 208.2, 214 B, 388; 357/23.4, 41; 307/311; 358/213.23

[56] References Cited

U.S. PATENT DOCUMENTS

| | | | |
|---|---|---|---|
| 3,654,468 | 4/1972 | Shah | 250/388 |
| 4,897,538 | 1/1990 | Lemaire et al. | 250/214 B |
| 5,084,639 | 1/1992 | Ribner | 307/311 |

OTHER PUBLICATIONS

"Analog VLSI And Neural Systems", Carver Mead, Addison-Wesley Publishing Company, Copyright 1989; pp. 32-39, 218-219, and 260-261.
"OPTEK Technology, Inc.", Data Book, pp. 1-12, and 1-13, Jul. 1989.
"Optoelectronics Data Book", Sharp Corporation, Aug. 1988/1989, pp. 24-39 and 52-53.
"Optoelectronics Data Book", Sharp Corporation, Feb. 1990, pp. 38-46.

Primary Examiner—David C. Nelms
Assistant Examiner—Que T. Le
Attorney, Agent, or Firm—Hill, Van Santen, Steadman & Simpson

[57] ABSTRACT

A monolithic integrated circuit using MOSFETs operatively configured in weak channel inversion made wherein pulses of light by interest are identified by identifying levels of light signal that exceed a threshold difference between a detected light level signal and a noise light level signal.

19 Claims, 2 Drawing Sheets

HIGH DYNAMIC RANGE INTEGRATED OPTO-ELECTRONIC SENSOR AND MOSFET AMPLIFIERS FOR PULSED LIGHT

BACKGROUND OF THE INVENTION

The present invention generally relates to systems for identifying pulses of light. More particularly, the invention relates to systems for sensing tracking holes in tapes, such as data tape streamers.

In conventional tape/media hole or end-of-media sensor systems, light emitting diodes (LEDs) or incandescent lamps are used as light sources. A tape generally is contained within a cassette and light beams generated by these light sources are directed onto the tape either directly or via a mirror. Discrete phototransistors are normally used to sense light penetrating through holes in the tape. The phototransistors are used both as light sensors and signal preamplifiers.

The discrete phototransistors generally are placed in nominal positions where the light beams from the light sources are expected to strike as the holes in the tape pass thereby. Thus, it is necessary to properly position the phototransistors to detect the tape holes.

The difficulties that arise during the production of such systems are well-known. These systems typically require some form of preamplifier gain adjustment to establish or set the signal level in front of a fixed threshold amplifier or comparator. This is normally provided by means of a potentiometer. However, designing for a fixed preamplifier gain is difficult and costly to implement in volume production because the spreads in optical and electrical DC transfer ratios are very large.

Further, the spread in light output is nearly always greater than 4:1 for the light sources or emitters, typically being 6:1 when the maximum and minimum values are specified for standard parts.

In addition to the foregoing, the emitted light will also vary with temperature, for example, typically by a ratio of 1.3:1. The gain spread for phototransistors is typically specified to be 2:1 at a fixed temperature, often more for standard parts.

Yet further, the dark currents of phototransistors vary greatly with temperature and this can easily cause a drift on the order of 100 millivolts in the DC output for worst case samples of phototransistors with large collector loads.

The calculations required to compensate for the foregoing variations are further complicated by the mechanical tolerances of the optical path in these systems including the tolerances in the placement of the light sources and the light sensors. Low cost discrete components tend to vary greatly in operation and there is a need to include large margins for noise and reasonable dynamic range. Accordingly, these sensor systems in a typical tape streamer are constructed for a 12-volt operation.

The presently available integrated sensor systems are sensitive and pick-up stray light which is often difficult to eliminate. The threshold levels thus specified for the systems are specified for the constant light input and hence there are small margins only provided for noise pick-up. Therefore, relatively large currents are needed in some applications to try the light sources to obtain good signal-to-noise ratios.

In these systems, the threshold level typically varies with temperature from $+/-10\%$ to $+/-20\%$, depending on the operating temperature range. To reduce the stray light pick-up problems and to increase the efficiency, infrared light sources and visible light cut-off filters have been used. In some applications requiring even more ambient noise suppression, synchronous demodulators are included on the integrated sensor chip. The sensor systems also include specifications for the ambient light.

In addition to the foregoing, the oscillator and driver for the light emitting diodes used as light sources are included in the synchronous receiver which may be disadvantageous in applications where the light source and light detector are physically separated.

Another problem that arises with respect to synchronous detectors is the excessive time delays or phase shifts which may occur for the light emitting diodes. Depending upon the type of emitters used, the phase shift may cause problems above, for example, 10-20 kH. In one solution to this problem, a carrier regenerator has been built into the receiver to reliably demodulate the signal. For many applications, for example magnetic tape hole detection, a frequency below 10 kH, as is used for synchronous detectors, is too low because the tape can be run at a speed of 120 inches/second.

A typical integrated photosensor is disclosed in a Data Book provided by OPTEK Technology, Inc. bearing publishing dates of 1989 and 1990. Copies of 1-12 and 1-13 of this data book are simultaneously filed herewith and freely incorporated by reference.

A general description of opto-electronic devices, including an integrated device, is provided in an Opto-electronics Data Book provided by Sharp Corporation bearing publishing dates of 1988 and 1989. Pages 24-33 thereof are fully incorporated herein by reference.

A description of one high speed response type OPIC light detector with a built-in signal processing circuit for a light modulation system is provided in a publication entitled "Optoelectronics Data Book - Supplementary Edition, 1990." This publication is also provided by Sharp Corporation. Pages 38 to 46 thereof are fully incorporated herein by reference.

SUMMARY OF THE INVENTION

The present invention provides a light pulse detection circuit that is immune to light noise interference without cumbersome post production adjustments to gain. Moreover, the present invention provides a light pulse detection circuit that is easily mass produced. Yet further, the invention provides a light pulse detection circuit with increased dynamic range without using voltages greater than $+5$ volts.

To this end, the invention provides a light pulse detection circuit wherein a total light level signal is compared with a noise light level signal and a supra-threshold difference is used to identify the presence of light pulses occurring above a preselected frequency. The circuit is constructed with MOS transistors operated in weak channel inversion (or sub-threshold operation).

A description of the operation of MOSFETs in weak channel inversion mode is provided in the book ANALOG VLSI AND NEURAL SYSTEMS by Carver Mead. Pages 33 to 39 of that book provide MOS transfer equations for weak channel inversion operation. Page 219 of that book illustrates in FIG. 3.17 a basic circuit for a "parasitic" phototransistor with logarithmic compression. Pages 260 to 261 of that book describe a phototransistor with the dynamic range illustrated in FIG. 15.3. Pages 33 to 39, 216, and 260-261 are fully incorporated herein by reference.

In an embodiment, the invention provides a monolithic mode integrated circuit using MOSFETs operated in weak channel inversion mode and operatively configured to provide a photosensitive element that is used to generate a total light level signal, a low pass filter that is used to pass only a noise light level signal referred to as a reference signal, which reference signal tracks the levels of DC stray light and the DC component of the pulsed light of interest and the level of low frequency AC light (e.g., less than 120 hz), and a comparing amplifier that is used to obtain a difference between the total light level signal and the noise light level signal and to generate a difference output signal when the difference exceeds a threshold.

Preferably, the pulsed light of interest has a low duty cycle to increase the noise margin.

In an embodiment, the low pass filter is constructed as a transconductance chain of follower-integrators, operated in weak channel inversion mode.

In an embodiment, the total light level signal that is compared with the noise light level signal is subject to a time delay so that an in-phase relationship is maintained between noise in the reference signal and noise in the total light level signal.

In an embodiment, all of the signal processing elements and photo sensor elements are integrated onto a single chip thereby providing a reduced production cost.

In an embodiment, the invention employing voltage signals in an embodiment of the invention employs current signal.

These and other features will become apparent from the following description of the presently preferred embodiment thereof, taken in conjunction with the accompanying drawings.

DETAILED DESCRIPTION OF THE PRESENTLY PREFERRED EMBODIMENTS

In accordance with the invention, a pulsed light sensor system is provided with automatic tracking wherein a total light level signal is compared to a noise light level signal, i.e., the low frequency components of the total light level signal, to identify the presence of particular pulses of light. Because only the difference between the noise light level and the total light level is of interest, the system is capable of operating over a high dynamic range, the range being limited only by the input capabilities of the comparison and/or difference function and/or the transistors used to build the sensor. Further, because of this arrangement, the use of floating capacitors needed for AC coupling between a preamplifier and a threshold is avoided.

Figure 1:
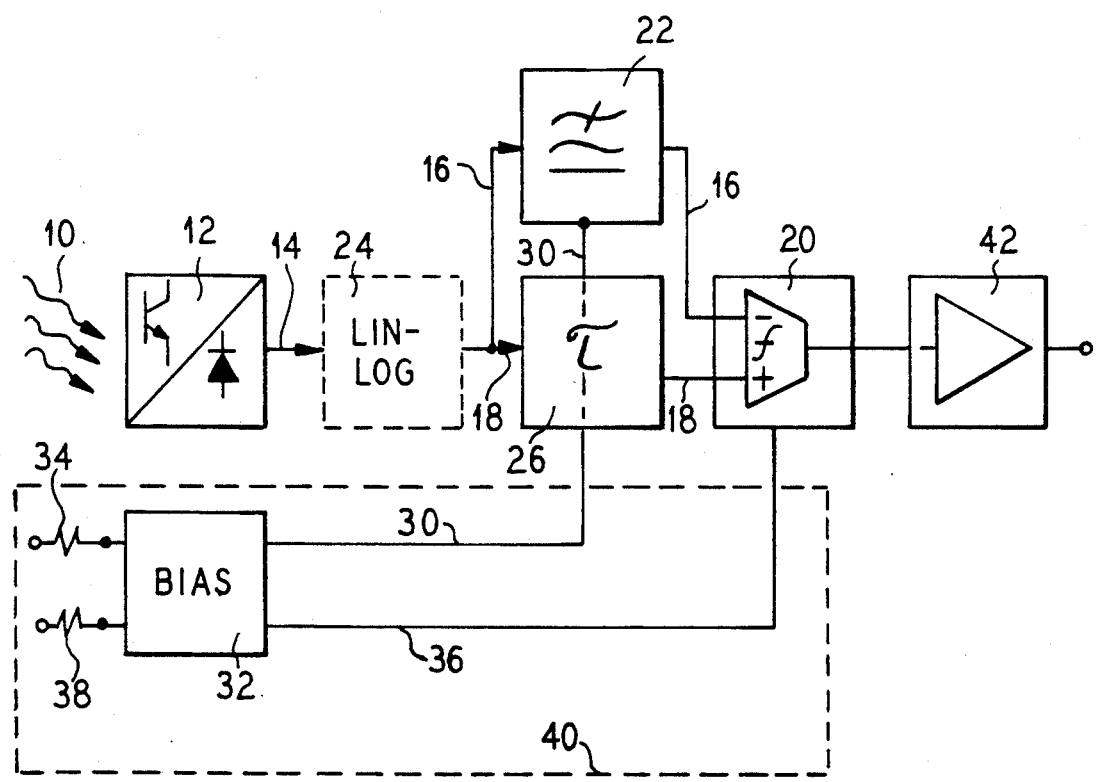
FIG. 1 illustrates a block diagram of a sensor system for detecting pulsed light.
Figure 2:
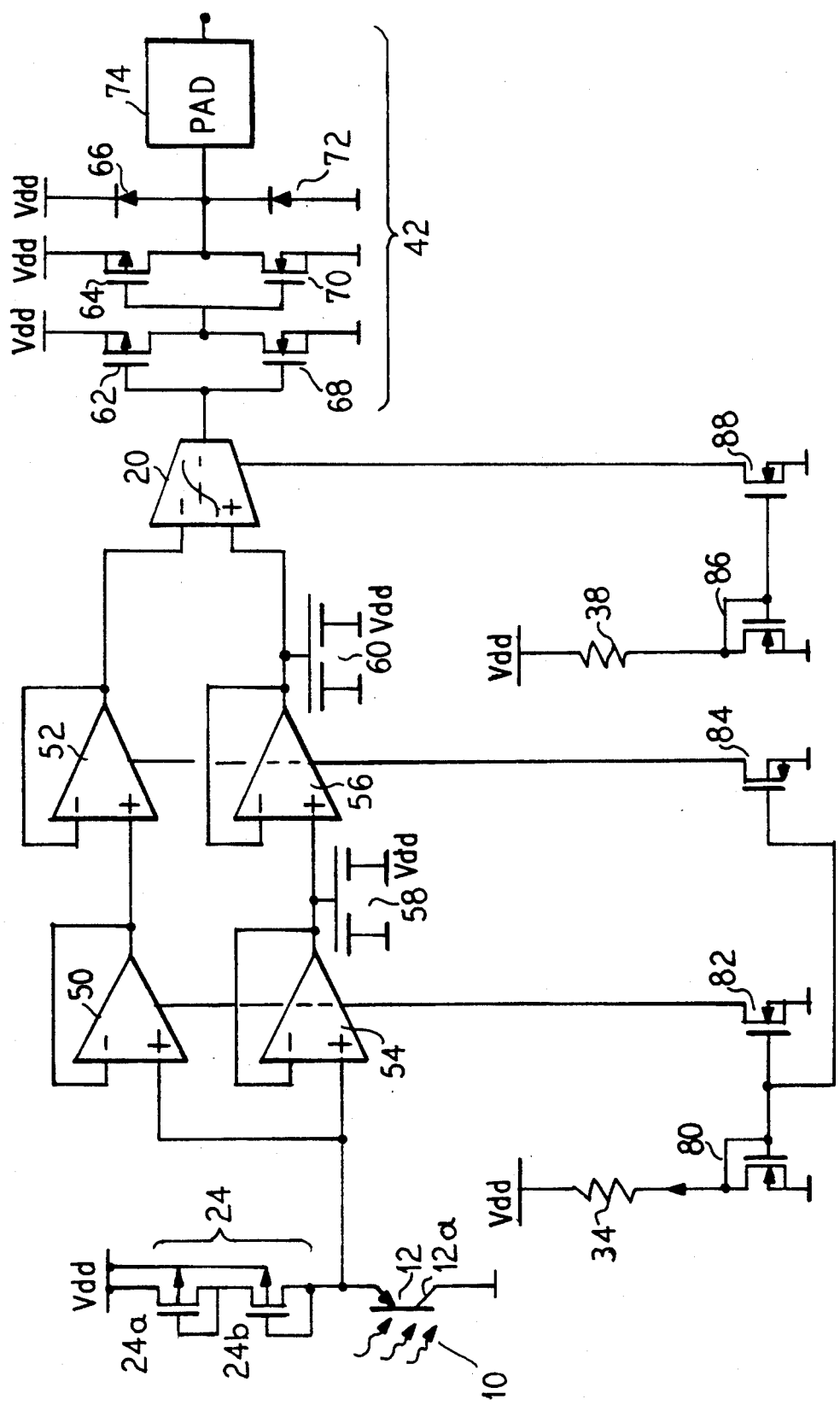
FIG. 2 illustrates a schematic view of the sensor system of FIG. 1 incorporating an optional logarithm signal compression circuit.

With reference to FIGS. 1 and 2, various implementations of the invention will be discussed.

In FIG. 1, light waves or rays 10 are received by a photosensor element 12 which, in turn, generates a total light level signal at an output 14. The light rays or waves 10 can be a combination of, for example, stray ambient light, stray light generated by light sources positioned to direct light beams onto a data tape, or light pass through holes in the data tape. The photo sensor element 12 can comprise one or more NPN or PNP phototransistors or PN photodiodes.

As further illustrated, the total light level signal is directed along split paths 16 and 18 to two inputs of a differential amplifier 20. In one path, the total light level signal is subject to low pass filtering by low pass filter element 22 to generate a noise light level also referred to herein as a reference signal. The low pass filter element 22 can be set to pass only a signal relating to the DC ambient light, the low frequency ambient light (i.e., below 120 Hz), and the DC component of the pulsed light, which preferably has a low duty cycle to increase the signal-to-noise ratio.

The other split path 18 is coupled to another input of the differential amplifier 20 such that a difference between the total light level and non-light level is obtained. The differential amplifier 20 preferably has a built-in threshold so that only if the difference between the total light level and the noise light level is great enough will the amplifier 20 generate an output.

As illustrated in FIG. 1, a suitable signal compression element 24 can be utilized to compress the signal output by the photosensor element 12 thereby to increase the dynamic range of the circuit. Preferably, the signal compression element 24 comprises a logarithmic compression element to convert the current from the photosensor element 12 to a voltage signal by using the inherent logarithmic/exponential characteristic of a MOS transistor operated in weak channel inversion mode.

This compression scheme is especially useful if the construction used for the sensor relies on voltage signals rather than current signals as the invention can be implemented in either a current signal construction or a voltage signal construction.

It can be appreciated that with the foregoing construction, low manufacturing costs can be obtained by integrating in one process all necessary signal processing elements onto a single chip, including the photosensor element 12. Further, the use of the illustrated low pass filtering scheme eliminates the need for floating capacitors utilized for AC coupling between a preamplifier and a threshold detector should a high pass filtering scheme be employed.

To ensure proper comparison between the total light level signal and the noise light level signal, it is necessary to maintain an in-phase relationship between the noise components of the respective signals. Accordingly, a time delay element 26 preferably is coupled between the output of the photosensor element 12 and the total light level signal input of the differential amplifier 20. Further, the low pass filter element 22 is designed to have a cut-off frequency such that a compromise between noise suppression and pulsed light signal detection is reached.

The use of a tailored low pass filter element 22 is an improvement over the AC coupling method used in conventional light pulse detectors because a steeper filter cut-off characteristic can be provided which, in turn, provides for better noise suppression. The DC coupling afforded by the illustrated system is advantageous in that it affords the use of simple and inexpensive CMOS integrated circuit technology.

To provide for selectability of the cut-off frequency of the low pass filter element, the filter element 22 and time delay element 26 can be provided with a control line 30 over which is transmitted a control signal. The control signal can be used to vary the transconductance of the elements 22 and 26 if these elements are constructed from voltage followers.

Preferably, such a control signal would be provided by a biasing controller 32. The biasing controller 32 would typically include a current mirror coupled to a power supply Vdd via resistors 34, so that externally supplied current is mirrored on the control line 30. The resistor 34 thus can be used to set the current on the control line 30.

The current on control line 30 thus sets the transconductance of the amplifier of low pass filter element 22 and the amplifier of the time delay element 26 which many themselves have current mirrors to scale the current on the control line 20 to appropriate values.

Similarly, the transconductance of the differential amplifier 20 can be set via another control line 36 whose current is set via the resistor 38 coupled to another current mirror in the controller 32 and to the power supply Vdd.

As also illustrated in FIG. 1, the output of the differential amplifier 20 can be directed to one or more buffer amplifiers 42. The buffer amplifier 42 can serve as an interface to an external digital receiver. The buffer amplifier 42 can be of a conventional type suitable to provide PAD and electrostatic discharge (ESD) protection.

It should be noted, however, that in certain constructions the complete controller network identified as module 40, need not be provided with the external resistor 34 and 38. In such constructions, the controller 32 is provided with fixed references for the filter element 22, timer delay element 26, and differential amplifier 20.

It can be appreciated that in the above-described embodiment, DC coupling is employed for all elements in the circuit at least up to the differential amplifier 20. This construction is advantageous in that:
 (a) a low pass filtering scheme can be employed and this provides for signal-to-noise ratio that is better than with AC coupling;
 (b) there is no need for floating capacitors;
 (c) the differential amplifier 20 does not have a fixed threshold which is temperature dependent, and there is no need for a built-in voltage regulator to provide a stable ground-referenced voltage; and
 (d) a DC tracking can be supplied to the differential amplifier 20 via noise path 16 and both signal and noise paths 18 and 16 will track temperature variations in the dark currents of the photosensor element 12 as well as changes in the ambient light. As long as the DC values are within the operating range for the differential amplifier 20, the amplifier 20 will operate properly. Further, the operating range can span more than five (5) orders of magnitude of change in the signal generated by the photosensor element 12 when the transistors need to construct the elements 20, 22, 24, and 26 are operated in weak channel inversion mode. Finally, the threshold input for the differential amplifier 20 is referred to the reference signal so that the threshold always tracks the noise light level and this provides a continuous offset that ensures that the amplifier 20 is in a predefined state when no pulsed light is present.

In FIG. 2, there is illustrated an greater detail a sensor system utilizing logarithmic signal compression. In this embodiment, the photosensor element 12 comprises a phototransistor 12a. The low pass filter element is comprised of operatively configured MOSFET amplifiers 54 and 56 and capacitors 58 and 60. MOSFET amplifiers 50 and 52 are configured to provide a simple delay matching network.

The logarithmic signal compression is provided by the inherent logarithmic/exponential character of the weak channel inversion operation of the transistor 24a and 24b. The transistors 24a and 24b convert the signal from the phototransistor 12a into a voltage signal. Thus, the illustrated embodiment can be referenced to as a voltage mode implementation of the invention as opposed to a current mode implementation.

Transistors 80, 82, 84, 86, and 88, are configured to provide current reflectors to reflect the currents in the optional external resistors 34 and 38 coupled to the power supply Vdd. It can be appreciated that transistors 82 and 84 can be utilized to scale the current passing through transistor 80.

The output buffer element 42 is comprised of operatively coupled transistors 62, 64, 68, and 70, diodes 66 and 72, and PAD protector 74.

While preferred embodiments have been shown, modifications and changes may become apparent to those skilled in the art which shall fall within the spirit and scope of the invention. It is intended that such modifications and changes be covered by the attached claims.

What is claimed is:

1. A monolithic integrated circuit using a photosensor element and MOSFETs operated in weak channel inversion mode and operatively coupled to form means for detecting pulses of light of interest by identifying levels of a light signal that exceed a threshold difference between a detected light level signal and a noise light level signal.

2. The circuit of claim 1, wherein the light is detected by a photosensor element that generates a light detection signal which is correlated to an amount of light sensed.

3. The circuit of claim 2, wherein the noise light level signal is generated by a low pass filter element coupled to the photosensitive element.

4. The circuit of claim 3, wherein a supra-threshold difference signal is generated by a comparing amplifier operatively coupled to the photosensitive element and the low pass filter.

5. A monolithic integrated sensor circuit utilizing MOSFET operated in weak channel inversion mode, comprising:
 a photosensitive element operative to sense light and to generate a light detection signal correlated to the amount of light sensed;
 a low pass filter operatively coupled to the light detection signal to filter out high frequency components from the light detection signal to generate a reference signal; and
 a comparing amplifier operatively coupled to the light detection signal and reference signal to generate an output signal correlated to the difference between the light detection signal and the reference signal when the difference exceeds a threshold.

6. The sensor circuit of claim 5, wherein the MOSFETs are CMOS transistors.

7. The sensor circuit of claim 5, wherein the MOSFETs are BiCMOS transistors.

8. The sensor circuit of claim 5, wherein the low pass filter element is constructed to pass noise components having frequencies at or below about 120 hertz.

9. The sensor circuit of claim 5, further including a logarithmic signal amplitude compression unit operatively coupled to the photosensitive element to compress the amplitude of the light detection signal.

10. The sensor circuit of claim 5, further including a time delay unit coupled between the photosensitive unit and the comparing amplifier and configured to maintain an in-phase relationship between noise signal components in the reference signal and the light detection signal.

11. The sensor circuit of claim 5, further comprising a buffer amplifier coupled to the output of the comparing amplifier.

12. The sensor circuit of claim 5, further comprising a pulse shaping circuit operatively coupled to the output of the buffer amplifier.

13. The sensor circuit of claim 5, wherein the low pass filter cut-off frequency is selectable by means of an externally provided signal.

14. The sensor circuit of claim 5, wherein the low pass filter cut-off frequency is predetermined.

15. An integrated opto-electronic sensor for pulsed light, comprising:
   a photo-sensitive element operative to sense light and to generate a light detection signal correlated to the amount of light sensed;
   a low pass filter operatively coupled to the light detection signal to filter out high frequency components from the light detection signal to generate a reference signal;
   a time delay element operatively coupled to the light detection signal to provide a time delay light detection signal that is in phase with respect to the reference signal; and
   a differential amplifier operatively coupled to the delayed light detection signal and reference signal to generate an output signal correlated to the difference between the light detection signal and the reference signal when the difference exceeds a threshold.

16. The sensor of claim 15, wherein the low pass filter element is constructed to pass noise components having frequencies at or below 120 Hz.

17. The sensor circuit of claim 15, further including a logarithmic compression unit that can sense signal amplitude operatively between the photo-sensor element to compress the amplitude of the light detection signal.

18. The sensor of claim 17, wherein the logarithmic signal amplitude compression unit relies on an inherent logarithmic exponential characteristic of MOSFETs operated in weak channel inversion mode to provide the compression of the amplitude of the light detection signal.

19. The sensor of claim 15, further comprising a bias controller operatively coupled to the low pass filter, the time delay element, and differential amplifier so that a transconduction of these elements can be selectively established.

* * * * *